United States Patent [19]

Panov et al.

[11] 4,425,507

[45] Jan. 10, 1984

[54] SPECIMEN CHAMBER OF ELECTRON PROBE INSTRUMENT

[76] Inventors: Anatoly F. Panov, ulitsa Sofii Kovalevskoi, 7, korpus 2, kv. 40; Vladimir I. Morozov, prospekt Stoikosti, 18, korpus 2, kv. 198; Kirill A. Makarov, ulitsa Sofii Kovalevskoi, 16, korpus 3, kv. 64; Alexandr V. Rudnev, prospekt Nauki, 41, kv. 23, all of Leningrad, U.S.S.R.

[21] Appl. No.: 348,005
[22] PCT Filed: Jun. 9, 1980
[86] PCT No.: PCT/SU80/00103
§ 371 Date: Feb. 3, 1982
§ 102(e) Date: Feb. 3, 1982
[87] PCT Pub. No.: WO81/03580
PCT Pub. Date: Dec. 10, 1981
[51] Int. Cl.³ .............................................. H01J 37/20
[52] U.S. Cl. ................................................. 250/442.1
[58] Field of Search ................................ 250/442, 310

[56] References Cited
U.S. PATENT DOCUMENTS
4,272,682 6/1981 Swann .......................... 250/442.1

Primary Examiner—Alfred E. Smith
Assistant Examiner—T. N. Grigsby
Attorney, Agent, or Firm—Murray Schaffer

[57] ABSTRACT

A specimen chamber of an electron probe instrument, comprising an airtight housing (1) accommodating a movable object stage (2) on which a specimen (3) is placed, and drive mechanisms for moving the object stage (2) along three mutually perpendicular coordinate axes, one of which is coincident with the electron-optical axis of the instrument, and for inclining the object stage (2) with respect to the electron-optical axis. The drive mechanism for moving the object stage (2) along the electron-optical axis comprises an eccentric pusher (69) having a hollow finger (70) secured to a shaft (65) and accommodating a slide (72) loaded with a spring (73) at the end facing the shaft (65) and having an axle (75) secured at its opposite end, on which there is mounted a rotatable roller (74) in permanent mechanical contact with the walls of a groove (76) provided in the base of a carriage (5) coupled to the stage (2). The carriage (5) is movable between two extreme positions on guides (17 and 54) parallel to the electron-optical axes, and has means for being locked in these extreme positions. The guides (17 and 54) are installed in a box-like frame (6) which is movable inside the housing (1) along another coordinate axis.

2 Claims, 2 Drawing Figures

SPECIMEN CHAMBER OF ELECTRON PROBE INSTRUMENT

FIELD OF THE INVENTION

The present invention relates to devices for investigating surfaces of specimens with the aid of electron probes and, more particularly, to specimen chambers of electron probe instruments.

Still more specifically, the invention relates to a mechanism for moving a specimen inside a specimen chamber of an electron probe instrument.

BACKGROUND OF THE INVENTION

Electron probe instruments, such as projection and scanning electron microscopes and X-ray microanalyzers, are used for morphological investigation of the surface of solid specimens and for ultimate X-ray analysis of such specimens. While using a scanning electron microscope to investigate a specimen with a complicated surface structure, for example, a specimen with microcracks, it is necessary to make frequent and rapid changes of magnification. At first the investigator uses a small magnification to observe a large portion of the specimen's surface and select an area to be investigated. When this is done the specimen is brought to a different position corresponding to a greater magnification, which makes it possible to investigate the selected area of the specimen with a sufficiently high resolution. The possibility of making rapid and frequent changes of magnification is extremely important. For example, a small magnification is used to pinpoint defects of integrated microcircuits, whereas a great magnification is required to find the cause the microcracks on their surface. In view of the above considerations, the present invention is aimed at speeding up and facilitating the investigation of specimens with the aid of electron probe instruments.

There is known a specimen chamber of an electron probe instrument (cf. accepted Japanese Application No. 49-33903 published Sept. 10, 1974), comprising an airtight housing which accommodates an object stage for a specimen, and drive mechanisms for driving the object stage along three mutually perpendicular coordinate axes one of which is coincident with the electron-optical axis of the instrument; the drive mechanisms also serve to incline the object stage in relation to the electron-optical axis of the instrument and rotate the object stage about that axis.

The drive mechanism for moving the object stage along the electron-optical axis comprises a carriage which is a movable plate connected through an airtight sealing element to the side wall of the specimen chamber and driven by a screw rotatable in a stationary nut rigidly attached to the housing. The plate is provided with a hole through which extends a column of coaxial hollow shafts which serve to move the object stage along two more coordinate axes, as well as to incline the stage in relation to the electron-optical axis and rotate it about that axis. The external shaft of the column serves to incline the stage with respect to the electron-optical axis. Rigidly secured to the end of this external shaft is a bracket carrying a mechanism which contains profiled strips along which the object stage can be driven in a desired direction. This mechanism rests on a second column of coaxial shafts which is connected to the first column through a third column of coaxial shafts whose shafts are coupled to those of the first and second columns by means of conical and cylindrical gears.

The specimen chamber under review is disadvantageous in that it does not allow a rapid change of magnification within a sufficiently broad range with a preselected constant scanning angle of the electron probe. The screw gauge of the mechanism for driving the object stage along the electron-optical axis is controlled manually and thus does not allow a rapid change of the stage's position. Hence it takes too much time to vary the magnification.

The specimen chamber under review is also disadvantageous in that the drive mechanism for driving the object stage along the electron-optical axis drives not only the object stage, but also a portion of the chamber's housing and elements of the other drive mechanisms. Considering the total mass to be set in motion, it is necessary that the drive be assembled from high-quality components. The great total mass of the components driven by the drive in question also leads to abrasive wear of the sealing element, which, in turn, may lead to a seal failure and contamination of the specimen's surface with particles removed from the sealing element by abrasion. Clearly, this may strongly affect the results of the analysis. Furthermore, the surface of the sealing element becomes rough because of the abrasion, which increases the friction and the force required to drive the plate. This, in turn, leads to abrasive wear of the conjugated screw gauge surfaces. The resultant backlash is another factor which affects the results of the analysis.

The specimen chamber under review is further disadvantageous in that the mechanisms for moving the object stage have a relatively large number of shafts and gears, as well as a complicated overall configuration. Because of this factor and also because of the cantilevered arrangement of the drive mechanisms in relation to the driven plate, external vibration brings about mechanical vibration of the stage, which blurs the image, affects the resolution and reduces the magnification.

SUMMARY OF THE INVENTION

What is desired is a small-size specimen chamber of an electron probe instrument, accommodating a compact mechanism for moving the specimen which would allow a rapid and accurate change of the specimen's position along the electron-optical axis during a rapid change of magnification with a constant scanning angle of the electron probe in combination with other simultaneous movements of the specimen.

The invention provides a specimen chamber of an electron probe instrument, comprising an airtight housing accommodating a movable object stage and drive mechanisms for moving the object stage along three mutually perpendicular axes one of which is coincident with the electron-optical axis of the instrument, as well as for inclining the object stage in relation to the electron-optical axis, characterized, according to the invention, in that the drive mechanism for moving the object stage along the coordinate axis coincident with the electron-optical axis of the instrument comprises an eccentric pusher having a shaft with a hollow finger rigidly attached to said shaft, said finger accommodating a slide which is spring-loaded at the end facing the shaft and has an axle rigidly secured at its opposite end, said axle carrying a rotatable roller in permanent mechanical contact with the walls of a groove provided in a base of a carriage which is coupled to the object stage and is movable on guides between two extreme points whereat stops are arranged, the guides being parallel with said coordinate axis and arranged in a frame accommodated in the housing and movable along another coordinate axis.

The stops on the guides may be pins rigidly secured to the carriage, symmetrical in relation to the electron-optical axis and receivable in holes provided in the frame.

The eccentric pusher, whose roller is in permanent mechanical contact with the base of the carriage coupled to the object stage, makes it possible to move the stage along the electron-optical axis of the instrument rapidly, but without jerks, which rules out mechanical vibration of the object stage. The rapid change of the stage's position is an important time-saving factor.

BRIEF DESCRIPTION OF THE DRAWINGS

Other objects and advantages of the present invention will become more apparent from a consideration of the following detailed description of a preferred embodiment thereof taken in conjunction with the accompanying drawings, wherein.

It is understood that the attached drawings are schematic and morely exemplary, and that they put no limitations as to the sizes of the components of the specimen chamber the ratios between these sizes, etc.

DESCRIPTION OF THE PREFERRED EMBODIMENT

Figure 1:
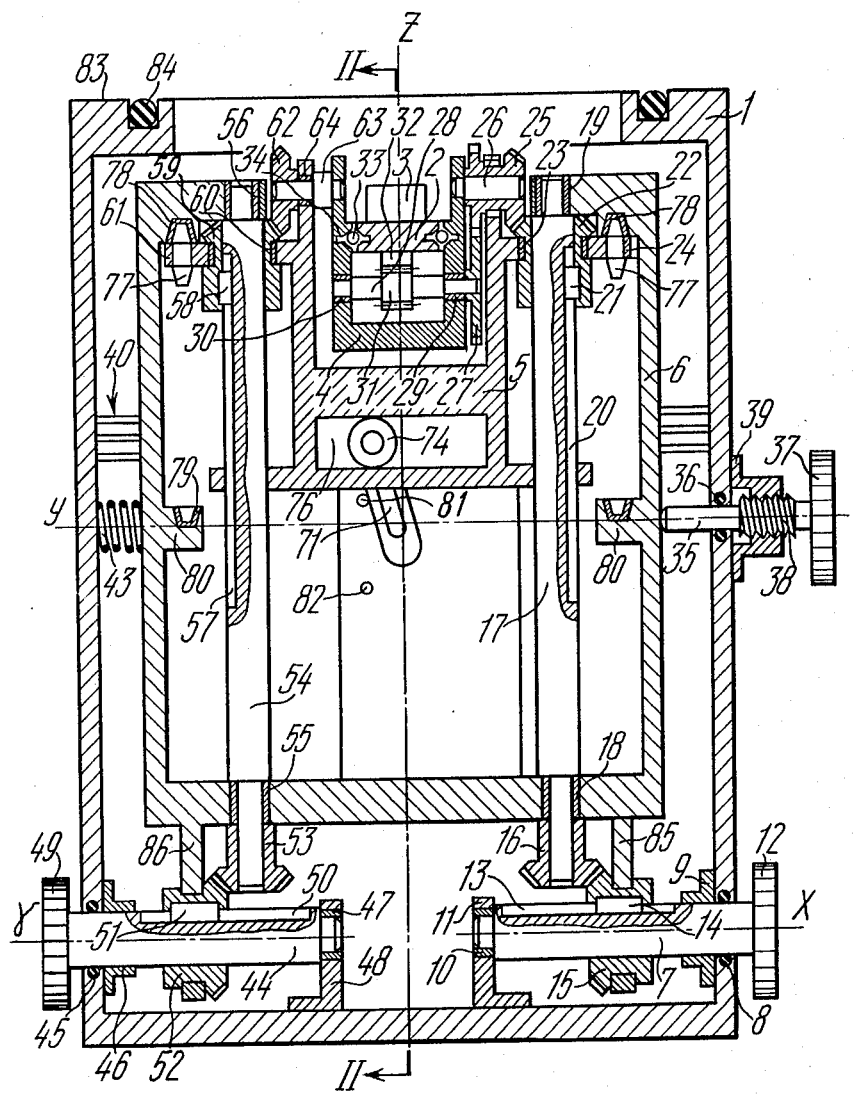
FIG. 1 is a cross-sectional view of a specimen chamber of an electron probe instrument, in accordance with the invention.

Referring to FIG. 1, the specimen chamber of an electron probe instrument comprises, according to the invention, an airtight housing 1 connected through crossovers to the final lens (not shown) of a scanning electron microscope in which the specimen chamber is incorporated. The housing 1 accommodates a movable object stage 2 on which a specimen 3 is placed, and drive mechanisms for moving the stage 2 and specimen 3 along three mutually perpendicular coordinate axes and for inclining the stage 2 in relation to one of these axes which is coincident with the axis of the electron-optical system of the microscope.

The movement of the stage 2 with the specimen 3 at a perpendicular to the plane of FIG. 1 will be referred to as movement along the X axis; the movement of the stage 2 from left to right and from right to left at a perpendicular to the X axis will be referred to as movement along the Y axis; the movement of the stage 2 up and down at a perpendicular to the X and Y axes will be referred to as movement along the Z axis. The Z axis is parallel to the axis of the electron-optical system and may be coincident with that axis. That stage 2 with the specimen 3 may be inclined in relation to the Z axis at an angle found in the plane of intersection of the X and Z axes.

The movement of the stage 2 with the specimen 3 along the X axis is always in the plane of the specimen 3. The stage 2 is movably arranged in a suspension 4 having a U-shaped cross-section. The stage 2 and suspension 4 can be inclined in relation to the Z axis. The suspension 4 is movably mounted on a carriage 5 with an H-shaped cross-section. The carriage 5, suspension 4 and stage 2 are all movable along the Z axis. The carriage 5 is movably arranged in a box-like frame 6 which, in turn, is movably arranged in the housing 1, being movable, like all the above-mentioned components, along the Y axis.

The drive mechanism for moving the stage 2 with the specimen 3 along the X axis comprises a horizontal shaft 7 which extends through a hole provided in the side wall of the housing 1 and having an annular sealing element 8 of vacuum-tight rubber. The shaft 7 is mounted in bearings 9 and 10 installed in the side wall of the housing 1 and in a fixed member 11, respectively. The fixed member 11 is attached to the bottom of the housing 1. Like all other bearings of the specimen chamber according to the invention, the bearings 9 and 10 are sliding bearings, although it is understood that at least some of the bearings used in the specimen chamber may be rolling bearings.

Attached to the end of the shaft 7 outside the housing 1 is a knob 12 for manual rotation of the shaft 7. Thus the operator can use the knob 12 to bring the object stage 2 and the specimen 3 to a desired position on the X axis. On the outside of the shaft 7 there is a longitudinally extending groove 13 which receives a movable key 14. The latter serves to connect the shaft 7 to a conical gear 15 mounted thereon. The conical gear 15 can rotate with the shaft 7 and at the same time move along the shaft 7 without disengaging from a conical gear 16 rigidly mounted on the lower end of a vertical shaft 17 which is parallel with the Z axis. The shaft 17 is mounted in bearings 18 and 19 installed in holes provided in the box-like frame 6. On the outside of the shaft 17 there is a longitudinally extending groove 20 which receives a movable key 21. The latter serves to connect the shaft 17 to a conical gear 22 mounted thereon. Thus the gear 22 can rotate with the shaft 17 in a sliding bearing 23 installed in an upper shelf 24 of the carriage 5; at the same time the gear 22 is movable in the vertical direction along the shaft 17 together with the carriage 5 without disengaging from a gear 25.

The gear 25 is mounted on an axle 26 and has a conical portion engaged with the conical gear 22, and a cylindrical portion engaged with a cylindrical gear 27. The latter is rigidly mounted on a shaft 28 received in bearings 29 and 30 installed in the side boards of the suspension 4. The shaft 28 has a pinion 31 meshed with a rack 32 attached to the back of the object stage 2. Being movably arranged in the suspension 4, the stage 2 rests on balls 33 arranged in prism-shaped grooves 34 provided in the side boards of the suspension 4 and in the sides of the stage 2.

The drive mechanism for moving the stage 2 and specimen 3 along the Y axis comprises a horizontal shaft 35 which extends through a hole in the side wall of the housing 1, having an annular sealing element 36 of vacuum-tight rubber. Mounted on the end of the shaft 35 outside the housing 1 is a knob 37. The operator uses the knob 37 to rotate the shaft 35 and thus manually bring the stage 2 with the specimen 3 to a desired position on the Y axis. The opposite end of the shaft 35 inside the housing 1 is in permanent mechanical contact with one of the side walls of the box-like frame 6.

On the outer surface of the shaft 35 there is a thread 38 meshed with the thread of a stationary nut 39 secured to the outer wall of the housing 1. The box-like frame 6 is movably mounted inside the housing 1 on ball-type guides 40 comprising balls 41 (FIG. 2) arranged in prism-shaped grooves 42 provided in the walls of the housing 1 and the box-like frame 6 which face each other. A cylindrical return spring 43 is arranged between the wall of the housing 1 (FIG. 1) and that wall of the box-like frame 6 which is opposite to the wall in contact with the free end of the shaft 35.

A drive mechanism which serves to incline the object stage 2 with the specimen 3 in relation to the Z axis comprises a number of components similar to those of the drive mechanism for moving the stage 2 along the X axis. More specifically, the drive mechanism for inclining the stage 2 with the specimen 3 comprises a horizontal shaft 44 which extends through a hole provided in the side wall of the housing 1 and having an annular sealing element 45 of vacuum-tight rubber. The shaft 44 is mounted in bearings 46 and 47 installed in the side wall of the housing 1 and in a fixed member 48, respectively. The fixed member 48 is secured to the bottom of the housing 1.

Mounted on the end of the shaft 44 outside the housing 1 is a knob 49. Using this knob 49, the operator rotates the shaft 44 and manually inclines the object stage 2 with the specimen 3 at a desired angle with respect to the Z axis. On the outside, the shaft 44 has a longitudinally extending groove 50 which receives a movable key 51. The latter serves to couple the shaft 44 to a conical gear 52 mounted thereon. The conical gear 52 rotates with the shaft 44 and at the same time moves along that shaft without disengaging from a conical gear 53 rigidly mounted on the lower end of a vertical shaft 54 parallel with the Z axis.

The vertical shaft 54 is mounted in bearings 55 and 56 installed in holes provided in the box-like frame 6. On the outside of the shaft 54 there is a longitudinally extending groove 57 receiving a movable key 58 which serves to couple the shaft 54 to a conical gear 59 mounted thereon. Thus the conical gear 59 is rotatable in a sliding bearing 60 installed in an upper shelf 61 of the carriage 5. As the gear 59 rotates with the shaft 54, it also moves in the vertical direction along the shaft 54 with the carriage 5 without disengaging from a gear 62.

The components 44 through 61 of the drive mechanism which serves to incline the object stage 2 are similar to the components 7 through 23 of the drive mechanism which serves to drive the stage 2 along the X axis. The former mechanism differs from the latter in that the gear 62 is strictly conical and rigidly secured to a shaft 63 mounted in a bearing 64 which is installed in the wall of the carriage 5. The opposite end of the shaft 63 is rigidly secured in the side board of the suspension 4 in which the object stage 2 is movably arranged.

The drive mechanism for moving the object stage 2 with the specimen 3 along the Z axis comprises a horizontal shaft 65 (FIG. 2) extending through a hole in the side wall of the housing 1, which hole is provided with an annular sealing element 66 of vacuum-tight rubber. The shaft 65 is mounted in a sliding bearing 67 installed in the side wall of the housing 1. Mounted on the end of the shaft 65 outside the housing 1 is a knob 68. The operator uses the knob 68 to rotate the shaft 65 and thus manually bring the stage 2 with the specimen 3 to a desired position on the Z axis.

An eccentric pusher 69 is mounted on the end of the shaft 65 inside the housing 1. The pusher 69 comprises a hollow finger 70 with a longitudinal slot 71 clearly shown in FIG. 1. One end of the hollow finger 70 (FIG. 2) is rigidly secured to the end of the shaft 65. A slide 72 loaded with a cylindrical spring 73 is arranged in that part of the hollow finger 70 which is remote from the shaft 65. A rotatable roller 74 is arranged at that end of the slide 72 which is remote from the spring 73. The roller 74 is mounted on an axle 75 which is rigidly secured to the slide 72 and extends through the longitudinal slot 71 provided in the hollow finger 70. The rotatable roller 74 is in permanent mechanical contact with the walls of a groove 76 provided in the base of the carriage 5.

The carriage 5 is movable along the coordinate Z axis between two extreme points. It moves on guides which are parallel with the Z axis. The function of the guides is performed by the shaft 17 (FIG. 1) of the drive mechanism for moving the object stage 2 along the X axis and the shaft 54 of the drive mechanism for inclining the stage 2 in relation to the Z axis. Progressive motion of the carriage 5 is possible because its upper shelves 24 and 61 are coupled to the conical gears 22 and 59 which can freely move along the respective shafts 17 and 54.

The drive mechanism in question also includes stops arranged at the extreme points reached by the carriage 5 as it moves on its guides. These are cone-shaped pins 77 which are symmetrical in relation to the electron-optical axis and rigidly secured to the carriage 5. More particularly, the cone-shaped pins 77 are attached to the upper shelves 24 and 61 of the carriage 5. When the carriage 5 reaches its upper extreme position the pins 77 are received in holes 78 provided in the upper portion of the box-like frame 6. When the carriage 5 reaches its lowermost position the pins 77 are received in holes 79 provided in internal projections of the box-like frame 6.

The eccentric pusher 69 is provided with stops which limit its angular displacement. These are stops 81 and 82 secured to the wall of the housing 1. Operation of these stops will be described below.

The housing 1 of the specimen chamber according to the invention has an upper surface 83 which is connected to the final lens housing (not shown) through a sealing element 84.

While the scanning electron microscope is used to investigate the surface of a specimen, the components of the drive mechanisms incorporated in the specimen chamber of the microscope interact as follows.

If the specimen is to be investigated at high and low magnification levels, the object stage 2 (FIG. 1) with the specimen 3 is first brought to a desired position in relation to the X and Y axes and inclined at a desired angle with respect to the Z axis.

To ensure a desired position of the stage 2 on the X axis, the operator turns the knob 12. The rotation of the knob 12 is transmitted to the shaft 7 and the conical gear 15 coupled to the shaft 7 by means of the movable key 12. The gear 15 transmits rotation to the conical gear 16. The latter rotates the shaft 17 on which it is rigidly mounted. Rotation of the conical gear 22 mounted on the shaft 17 is transmitted to the gear 25 meshed with the gear 22. Through the gear 27 meshed with the gear 25, rotation is transmitted to the shaft 28 on which the gear 27 is rigidly mounted. As the shaft 28 rotates, the stage 2 with the specimen 3 moves along the X axis on the balls 33 arranged in the grooves 34, keeping in mind that the pinion 31 of the shaft 28 is in permanent contact with the rack 32 attached to the back of the object stage 2.

An inclination of the stage 2 at a desired angle $\gamma$, relative to the Z axis is effected in an almost similar manner. As the operator turns the knob 49, rotation of the shaft 44 is transmitted to the conical gear 62 through the kinematic chain composed of the members 51, 52, 53, 54, 58 and 59 similar to the members 14, 15, 16, 17, 21 and 22. The manner in which rotation of the shaft 44 is transmitted to the gear 62 is described above. Rotation of the gear 62 is transmitted to the shaft 63 on which the gear 62 is rigidly mounted. Rotation of the shaft 63 results in an angular displacement of the suspension 4 rigidly connected to the shaft 63 and, consequently, an angular displacement of the object stage 2 and the specimen 3 which are arranged in the suspension 4.

In order to ensure a desired position of the stage 2 with the specimen 3 on the Y axis, the knob 37 is turned. As a result, the shaft 35 connected to the knob 37 is set in motion in the stationary nut 39. As the knob 37 is turned in one direction, the end of the shaft 35, which is permanently in contact with the wall of the box-like frame 6 due to the action of the cylindrical spring 43, pushes the frame 6 so that it moves on the ball-type guides 40 from right to left along the Y axis (according too the drawing). The stage 2 with the specimen 3 is connected to the frame 6 through the suspension 4, so it also moves along the Y axis. As the knob 37 is turned in the opposite direction, the end of the shaft 35 is also driven in the opposite direction, although it continues to maintain contact with the box-like frame 6 due to the return action of the spring 43. As a result, the frame 6 and the stage 2 with the specimen 3 move from left to right.

As the box-like frame moves in any direction on the guides 40 along the Y axis, the pairs of conical gears 15–16 and 52–53 continue to be engaged. This is due to the fact that the gears 15 and 52 slide on the shafts 7 and 44, respectively, since they are coupled to the keys 14 and 51, respectively, movable in the longitudinal grooves 13 and 50. This is also due to the fact that the gears 15 and 52 are meshed with the projections 85 and 86, respectively, provided on the outer side of the bottom of the box-like frame 6, and rotate in relations to these projections 85 and 86. This means that while the stage 2 with the specimen 3 is being moved to a desired point on the Y axis, it can also be set in motion along the X axis or slanted with respect to the Z axis; this also means that all the three operations can be performed simultaneously. For all practical purposes, the work of any drive mechanism incorporated in the specimen chamber has no effect on the operation of the other drive mechanisms.

Thus the object stage 2 with the specimen 3 is brought to a desired position on the X and Y axes so that it is also found on the Z axis which is conicident with the electron-optical axis of the microscope, and inclined at a desired angle γ with respect to the electron-optical axis. This is followed by setting a desired maximum or minimum magnification level with the aid of the electron-optical system (not shown), which corresponds to the uppermost or lowermost position of the object stage 2 with the specimen 3 on the axis Z. The stage 2 is then brought to the lowermost position corresponding to a minimum magnification level.

Figure 2:
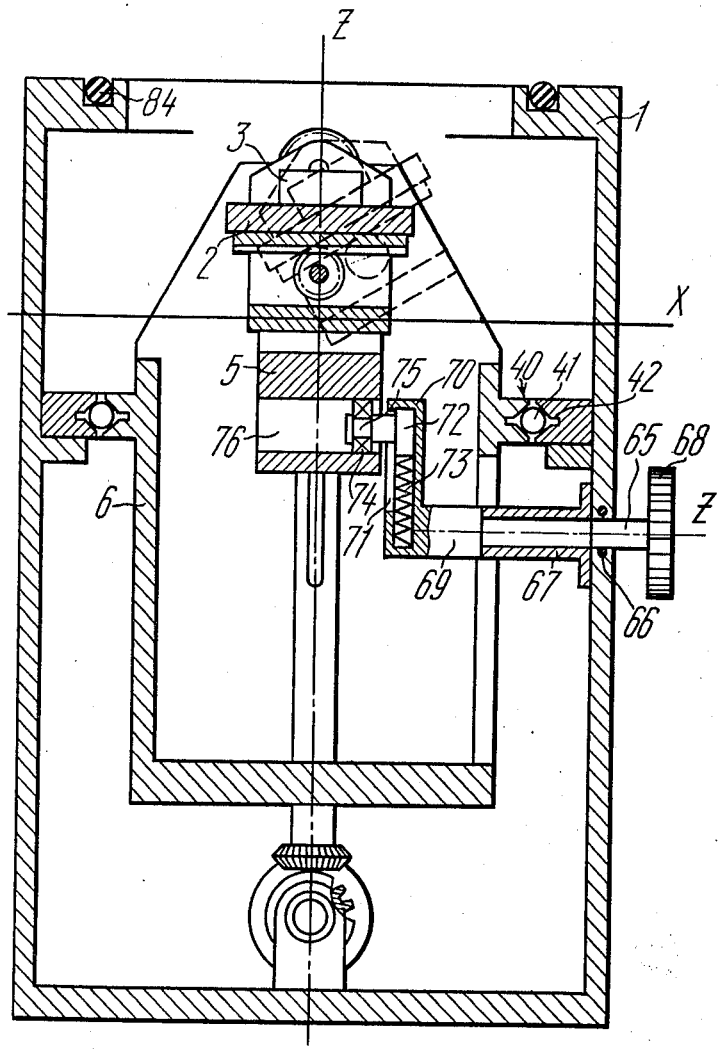
FIG. 2 is a section taken on line II—II of FIG. 1.

In FIGS. 1 and 2, the stage 2 with the specimen 3 is shown in the uppermost position on the Z axis. In order to bring it to the lowermost position, the operator turns the knob 68 (FIG. 2). The knob 68 transmits rotation to the shaft 65 on which it is mounted. As a result, the eccentric pusher 69 rotates clockwise in the plane of FIG. 1 and towards the viewer in FIG. 2. As this takes place, one of the components of the force applied to the wall of the groove 76 of the carriage 5 is directed upwards. Thus the roller 74 of the pusher 69 drives the carriage 5 downwards from its uppermost position. The carriage 5 moves on its guides whose function is performed by the shafts 17 and 54. It must be noted at this point that the carriage 5 moves quite easily, because the gears 22 and 59 slide freely on the shafts 17 and 54, respectively. As the carriage 5 is in motion, the roller 74 continues to maintain contact with the walls of the groove 76. This is due to the spring 73 which pushes the slide 72 from the hollow finger 70 so that the roller 74 is pressed against the walls of the groove 76.

The motion of the carriage 5 is not discontinued when the hollow finger 70 of the pusher 69 comes in contact with the lower stop 82. The cone-shape pins are received in the holes 79 provided in the projections 80. Thus the carriage 5 and the stage 2 are brought exactly to a desired position on the electron-optical axis and locked in that position due to the interaction between the eccentric pusher 69 and the stop 82. The eccentric pusher is always rotated through an angle somewhat greater than 180°, because the stops 81 and 82 are a short distance away from the electron-optical axis. Thus with the carriage 5 in an extreme position, the hollow finger 70 of the eccentric pusher 69 is at an angle to the electron-optical axis, so one of the components of the force with which the spring 73 acts on the roller 74 is applied through the roller 74 to the carriage 5 and presses it against the box-like frame 6; as a result, the carriage 5 is absolutely at rest with respect to the frame 6. Another component of the above-mentioned force is applied through the hollow finger 70 to the stop 81 or 82. The finger 70 is pressed against one of these stops, whereby the carriage 5 is safely locked in place with respect to the housing 1. A spontaneous withdrawal of the eccentric pusher from the stops 81 and 82 is practically impossible.

With the carriage 5 in the lowermost position, magnification is at a minimum level and the operator selects the area to be investigated on the surface of the specimen 3. When this area is located, the operator brings the carriage 5 and, consequently, the stage 2 with the specimen 3, to the uppermost position. Thus the magnification level is brought to a maximum and a detailed study of the selected area on the surface of the specimen 3 can be undertaken. This is done as follows. The operator turns the knob 68 in the opposite direction. As the eccentric pusher 69 is rotated anti-clockwise, the carriage 5 is brought to its uppermost position. The accurate positioning of the carriage 5 is ensured by the cone-shaped pins 77 received in the holes 78. The carriage 5 is safely locked in this position due to the interaction between the eccentric pusher 69 and the stop 81, which is described above.

Thus the full range of displacement of the carriage 5 along the electron-optical axis is attained by turning the eccentric pusher 69 through an angle just slightly in excess of one half of a turn. Clearly, it does not take much time to bring the carriage 5 from one position to another, considering the ease of its movement.

The specimen chamber of this invention has a number of advantages over conventional specimen chambers employed in electron probe instruments.

The drive mechanisms of this chamber are prefectly balanced, which considerably mitigates the effects of external vibration. This improves the reproducibility of the specimen position on the electron-optical axis and reduces the spread of preset magnification values.

The possibility of a rapid transfer of the object stage from one position to another reduces the duration of an analysis several times and thus increases the number of analyses performed per unit of time. This cuts down the operating costs, and the microscope quickly pays for itself.

The possibility of repeatedly bringing the object stage to a desired position and the reliable locking of the stage in that position accounts for an excellent reproducibility of the results of investigation.

The above advantages of the specimen chamber according to the invention account for an improved performance of electron microscopes in which such chambers are used. As a result, such microscopes can be used for large-scale manufacture of various items, including large-scale integrated circuits, in which case they considerably reduce the production costs by bringing down the amount of rejects.

COMMERCIAL APPLICABILITY

The invention is best applicable to small-size research scanning electron microscopes and small-size commercial scanning electron microscopes which are used for quality inspection of mass-produced articles.

We claim:

1. A specimen chamber of an electron probe instrument, comprising an airtight housing accommodating a movable object stage on which a specimen is placed, and drive mechanisms for moving the object stage along three mutually perpendicular coordinate axes, one of which is coincident with the electron-optical axis of the electron probe instrument, and for inclining the object stage in relation to said electron-optical axis, characterized in that the drive mechanism for moving the object stage (2) along the coordinate axis coincident with the electron-optical axis of the instrument comprises an eccentric pusher (69) having a shaft (65) with a hollow finger (70) secured to said shaft (65) and accommodating a slide (72) loaded by a spring (73) at the end facing the shaft (65), while at the opposite end of said slide (72) there is rigidly secured an axle (75) on which there is mounted a rotatable roller (74) in permanent mechanical contact with the walls of a groove (76) provided in the base of a carriage (5) which is coupled to the stage (2), movable between two extreme points on guides (17, 54) and has means for being locked in its extreme positions on said guides (17, 54) which are parallel with said coordinate axis and are installed in a frame (6) arranged in the housing (1) and movable along another coordinate axis.

2. A specimen chamber of an electron probe instrument as claimed in claim 1, characterized in that the means for locking the carriage (5) in its extreme positions are pins (77) rigidly secured to the carriage (5) so that they are symmetrical with respect to said electron-optical axis and receivable in holes (78, 79) provided in the frame (6).

* * * * *